US006829724B2

United States Patent
Farabaugh et al.

(10) Patent No.: US 6,829,724 B2
(45) Date of Patent: Dec. 7, 2004

(54) METHOD FOR MONITORING THE CONDITION OF A BATTERY IN A HIGH TEMPERATURE HIGH CURRENT ENVIRONMENT

(75) Inventors: Mark Farabaugh, Sunnyvale, CA (US); Michael D. Derbish, Pleasanton, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/247,240

(22) Filed: Sep. 18, 2002

(65) Prior Publication Data

US 2004/0054484 A1 Mar. 18, 2004

(51) Int. Cl.[7] .............................................. G06F 11/00
(52) U.S. Cl. ........................... 714/14; 711/135; 714/22
(58) Field of Search ........................... 711/135; 714/14, 714/22, 6, 340; 429/61; 324/771; 702/108, 176, 183; 707/204; 713/340

(56) References Cited

U.S. PATENT DOCUMENTS

| | | | | |
|---|---|---|---|---|
| 5,448,719 A | * | 9/1995 | Schultz et al. ................. | 714/5 |
| 5,458,991 A | * | 10/1995 | Severinsky .................... | 429/61 |
| 5,905,994 A | * | 5/1999 | Hori et al. .................... | 711/113 |
| 6,236,226 B1 | * | 5/2001 | Hagiwara ..................... | 324/771 |
| 6,268,665 B1 | * | 7/2001 | Bobry .......................... | 307/66 |

* cited by examiner

Primary Examiner—Marc S. Hoff
Assistant Examiner—Paul Kim
(74) Attorney, Agent, or Firm—Kudirka & Jobse, LLP

(57) ABSTRACT

A method for battery condition testing. In one embodiment, the method is comprised of interrupting AC power service to a data storage system. The interruption causes an exhaustible power source to provide operating power to the data storage system. The exhaustible power source is coupled to said data storage system. The exhaustible power source is adapted to provide operating power to the data storage system when the AC power service to the data storage system is interrupted. The method is further comprised of discharging the exhaustible power source by operating the data storage system with the exhaustible power source for a specified period of time less than full discharge but sufficient to fully flush the cache. The exhaustible power source passes the condition testing provided the exhaustible power source provides operating power to the data storage system for the specified period of time. The method is further comprised of recharging the exhaustible power source subsequent to the exhaustible power source passing the condition testing.

22 Claims, 8 Drawing Sheets

METHOD FOR MONITORING THE CONDITION OF A BATTERY IN A HIGH TEMPERATURE HIGH CURRENT ENVIRONMENT

FIELD OF THE INVENTION

The present invention relates to the field of rechargeable power sources. More particularly, embodiments of the present invention provide a method for monitoring the condition of exhaustible power sources.

BACKGROUND OF THE INVENTION

Today's computer networks are usually comprised of multiple interconnected computer systems. Some of the computer systems are configured for use by individuals/users. These computer systems are normally referred to client or local computer systems. Other computer systems, also present within the network, are configured to facilitate the interaction between the client or local computer systems and the network to which they are connected. These other computer systems are commonly referred to as server or host computer systems. Additionally, it is common for many of today's large companies to have hundreds or thousands of servers and client computer systems.

Further, both the server and client computer systems generate vast amounts of data containing a nearly endless variety of information. Portions of the data can contain information that can be considered mission critical and, as such, needs to be retained for future use and/or stored in a relatively permanent manner.

Currently there are numerous types of data storage systems that are designed to store the vast amounts of data. Examples of various data storage systems can include, but are not limited to, tape backup, disk mirroring, CD storage, multiple intercoupled data storage devices, and others.

A commonality among many types of data storage systems is the requirement of a power source, e.g., AC mains. Another similarity among many types of data storage systems is that data is first placed in a buffer or cache memory before it is written to a storage device or to an array of storage devices.

Brown-outs and black-outs, natural disasters, acts of terrorism, power generator failures, fires, and downed power lines, are but a few of the types of occurrences that can cause AC mains to become non-functional. Further, when an AC main fails, it is quite common for any information that was placed in the buffer or cache to be lost. This is especially disadvantageous for important information that had yet to be written to a data storage system.

To overcome this disadvantage, many data storage devices are coupled with a UPS (uninterruptible power supply) that provides power when there is an AC main failure. Another method of providing backup power includes placing batteries on the computer system board. Yet another method of providing backup power is to place a battery on the controller, and when the system is rebooted, there is an image of the data that was placed in the cache, which is then regenerated.

A disadvantage to batteries is that high current batteries, e.g., NiCad batteries, have been used mainly in the power tool arena and other low tech, non-mission critical environments. Further, high tech battery applications have been utilized in laptop batteries, which do not require the high current, high temperature demand of large storage systems, e.g., rack mounted RAID systems.

Conventionally, when there is a power failure, the data storage system quickly dumps the entire cache into a designated portion of one or two drives. By virtue of all of the drives not being used during the dump, battery backup loads are much smaller.

Disadvantageously, backup batteries can, over time, lose some of their ability to provide a consistent backup charge. It is common for backup batteries to have their ability to hold a charge diminished. In a worst case scenario, a battery may not have the ability to hold a charge for any period of time, thus causing a loss of data by not providing the backup power as presumed. Accordingly, if an AC main goes down, there is a possibility that the backup battery may not be able to store enough energy long enough to enable writing of the cache before battery power is exhausted.

Additionally disadvantageous is that in certain instances, checking or testing the condition of the battery can itself have a detrimental effect on the battery's ability to hold a charge. For example, many battery manufacturers recommend a complete discharge of the battery periodically in order to test the device. In a high temperature, high current environment, e.g., multiple intercoupled data storage devices such as a RAID system, a complete discharge of the battery can cause elevated temperatures within the data storage system as well as in the battery. It is well known that elevated temperatures in a data storage system can severely and detrimentally effect the operation of the data storage system. Further disadvantageous is that by subjecting the battery to increased temperatures, the ability of the battery to be recharged is substantially reduced. Additionally disadvantageous is that continued complete discharge/recharge of a battery increases, in many instances, the occurrence of battery failure, the complete inability of a battery to hold any charge.

SUMMARY OF THE INVENTION

Thus a need exists for an improved method to monitor the condition of a backup battery. A further need exists for a method for testing the condition of the backup battery in a server system that does not adversely affect the condition of the backup battery or degrade the performance of the system.

Embodiments of the present invention are drawn to providing a method and system for monitoring the condition of a backup battery that does not adversely effect the condition of the backup battery.

In one embodiment, a method for battery condition testing comprises interrupting AC power service to a data storage system which causes an exhaustible power source to provide operating power to the data storage system. The exhaustible power source is coupled to the data storage system. The data storage system includes a data buffer and/or cache memory. The exhaustible power source is adapted to provide operating power to the data storage system when the AC power service to the data storage system is interrupted. Particularly, the power source monitors the data buffer during periods of AC main interruption. The method is further comprised of discharging the exhaustible power source by operating the data storage system with the exhaustible power source for a specified period of time. The exhaustible power source passes the condition testing when the exhaustible power source provides operating power to the data storage system for the specified period of time. Importantly, the battery is only discharged for the period of time that it is expected to provide power during an actual interruption of the AC main. This time period is based on the time required to copy the data from the buffer to the disk drives. The method is further comprised of recharging the exhaustible power source subsequent to the exhaustible power source passing the condition testing.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

A method and system for monitoring the condition of a backup battery, e.g., in a high current, high temperature environment, are described. In the following description, for purposes of explanation, numerous specific details are set forth in order to provide a thorough understanding of the present invention. It will be obvious, however, to one skilled in the art that the present invention may be practiced without these specific details. In other instances, well known and structures and devices are shown in block diagram form in order to avoid obscuring the present invention.

The present invention is discussed primarily in the context of a network of computer systems, e.g., servers, workstation, desktop, and laptop computer systems. However, it is noted that the present invention can be used with other types of devices that have the capability to access some type of central device or central site, including but not limited to handheld computer systems, cell phones, pagers, and other electronic devices which are adapted to provide Internet and Intranet access.

Figure 1A:
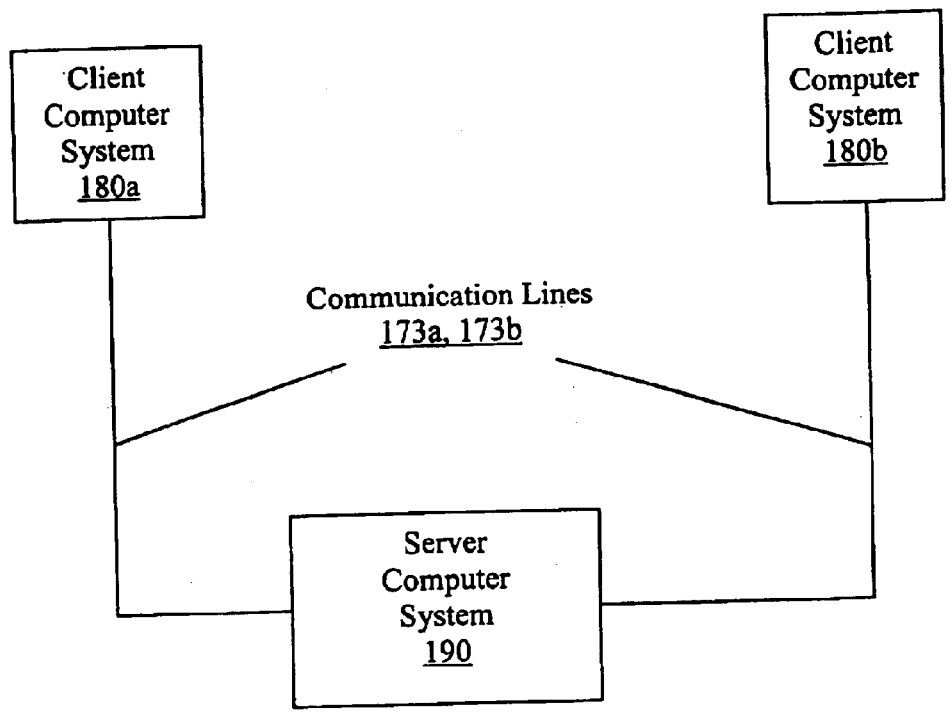
FIG. 1A is a block diagram of network environment upon which embodiments of the present invention can be practiced.

FIG. 1A is a block diagram illustrating a client-server computer system network 100 ("network 100") upon which embodiments of the present invention may be practiced. Network 100 may be a communication network located within a firewall of an organization or corporation (an "Intranet"), or network 100 may represent a portion of the World Wide Web or Internet. Client (or user) computer systems 180a and 180b and server computer system 190 are communicatively coupled via communication lines 173a and 173b; the mechanisms for coupling computer systems over the Internet or over Intranets are well-known in the art. For instance, this coupling can be accomplished over any network protocol that supports a network connection, such as Internet Protocol, TCP (Transmission Control Protocol), NetBIOS, IPX (Internet Packet Exchange), and LU6.2, and link layers protocols such as Ethernet, token ring, an ATM (Asynchronous Transfer Mode). Alternatively, client computer systems 180a and 180b can be coupled to server computer system 190 via an input/output port (e.g., a serial port) of server computer system 190; that is, client computer systems 180a and 180b and server computer system 190 may be non-networked devices. It is appreciated that, for illustration, only two client computer systems and a single server computer system are shown; however, it is understood that network 100 may comprise any number of client computer systems and server computer systems.

Figure 1B:
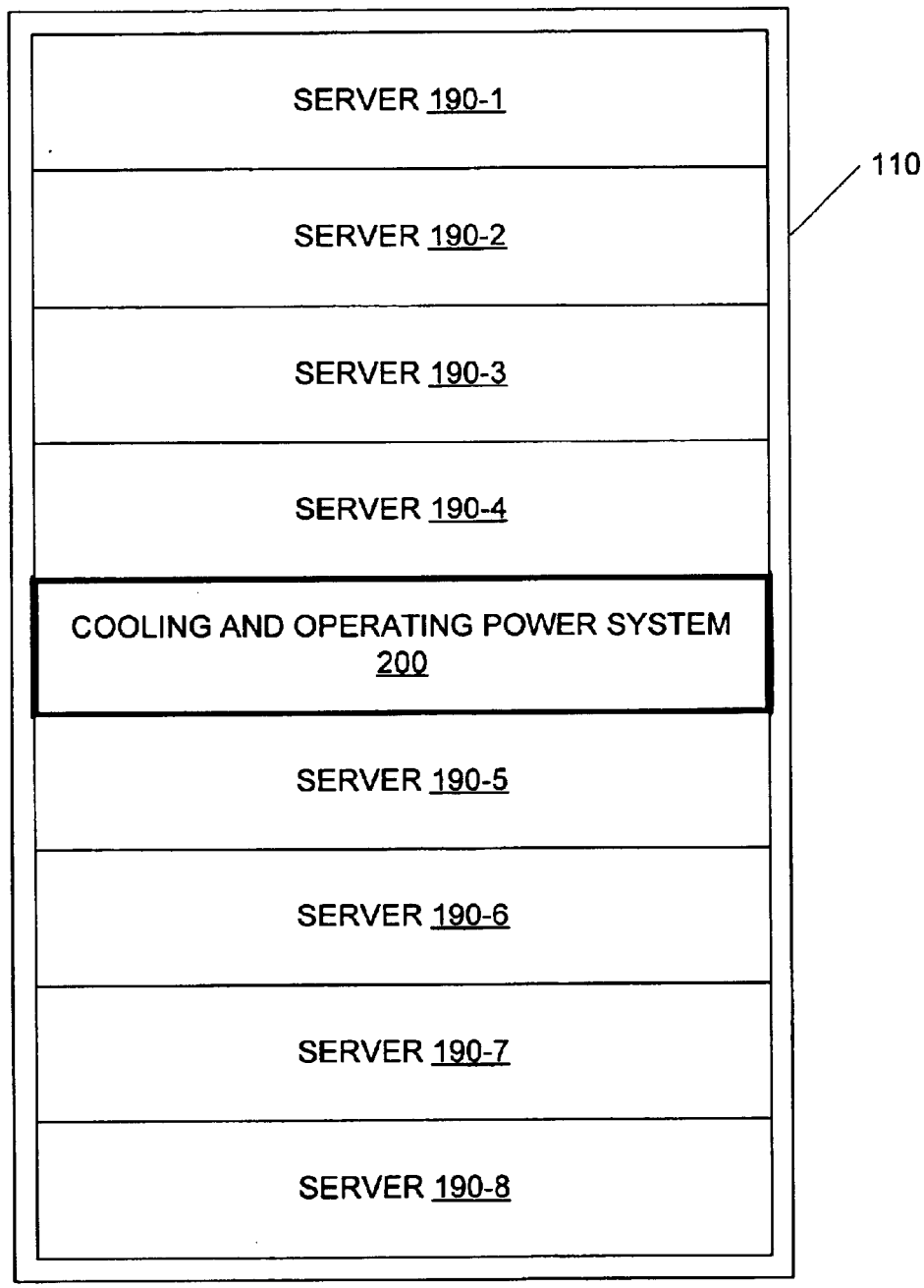
FIG. 1B is a block diagram of a network storage housing upon which embodiments of the present invention can be practiced.

FIG. 1B is a block diagram illustrating a network storage housing 110 upon which embodiments of the present invention may be practiced. FIG. 1B shows, in one embodiment, network storage housing 110 having disposed therein a plurality of servers, e.g., server 190 of FIG. 1A, and which are indicated as servers 190-1 to 190-8. Also shown in FIG. 1B is a system 200, analogous to system 200 of FIG. 2. System 200 is configured to provide cooling and operating power to each instance of server 190 disposed within network storage housing 110 when conventional power service, e.g., power from AC mains, is interrupted and/or fails.

Figure 4A:
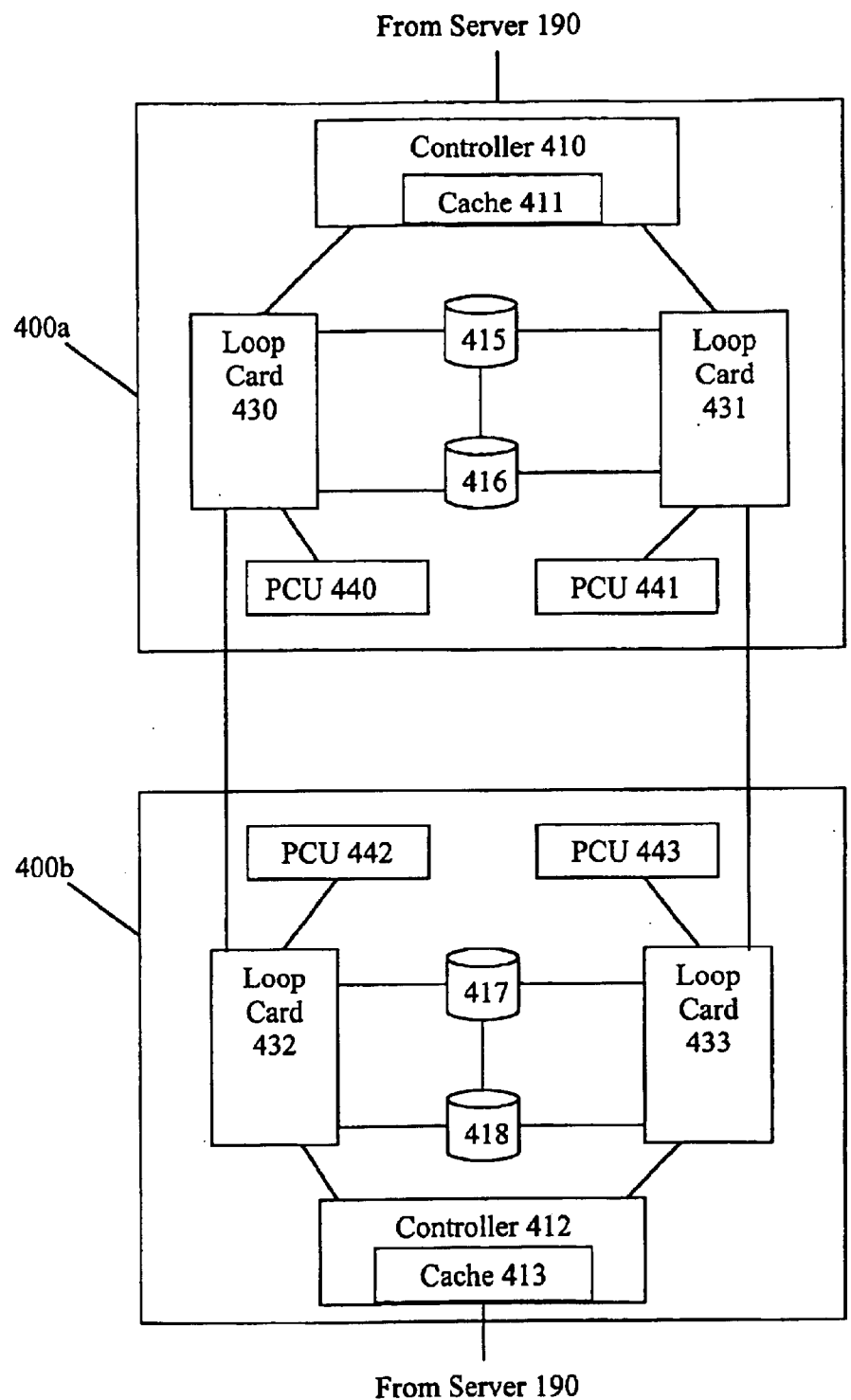
FIG. 4A is a block diagram illustrating a plurality of systems for adjusting cache levels relative to charge levels of an exhaustible power source coupled together in a partner pair configuration, in accordance with one embodiment of the present invention.
Figure 4B:
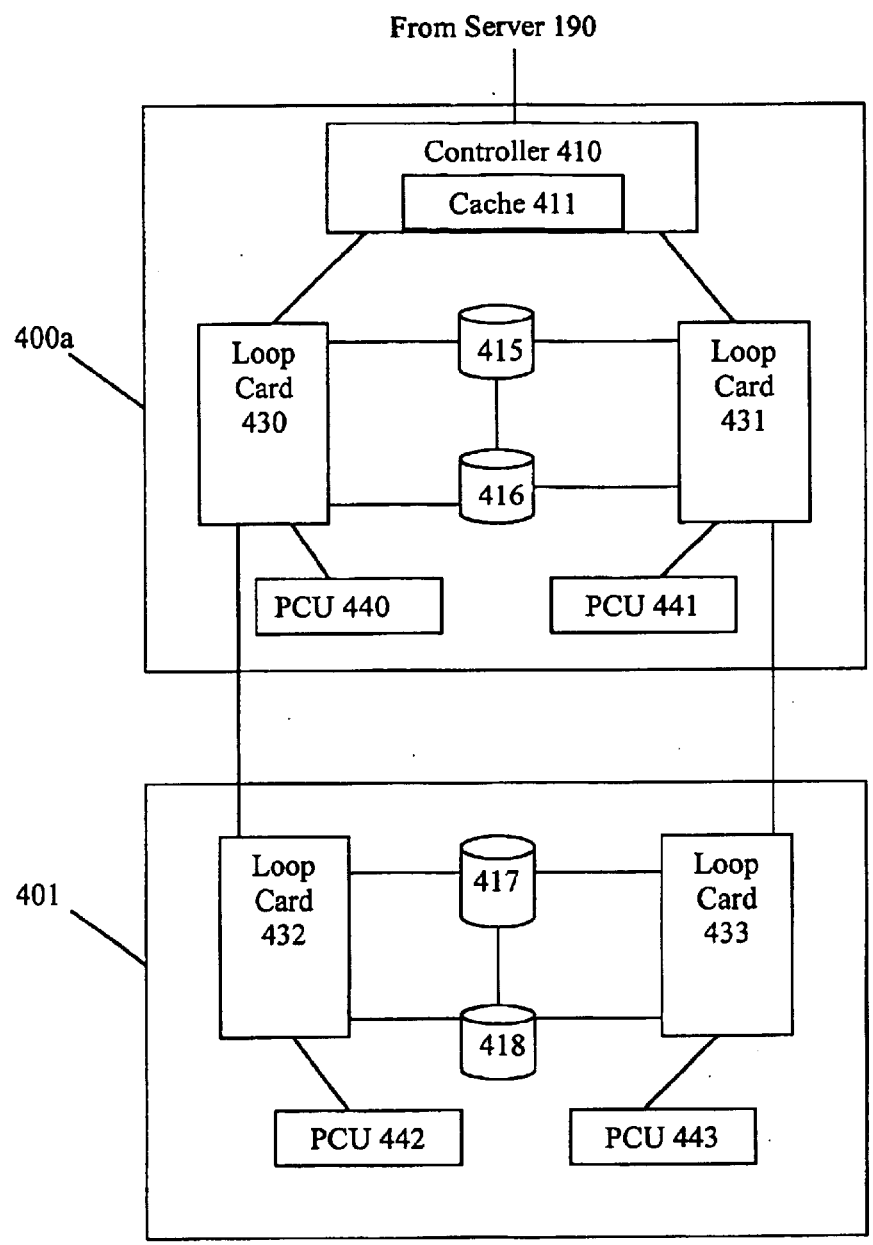
FIG. 4B is a block diagram illustrating a plurality of systems for adjusting cache levels relative to charge levels of an exhaustible power source coupled together in a unified cache configuration, in accordance with one embodiment of the present invention.

Still referring to FIG. 1B, in one embodiment, network storage housing 110 is a rack mounted RAID (redundant array of inexpensive disks) data storage system. It is noted that embodiments of the present invention are well suited to be implemented in nearly any data storage system. It is further noted that although network storage housing 110 is shown having eight servers disposed therewith, servers 190-1 to 190-8, respectively, network storage housing 110 can have nearly any number of servers disposed therewith. As such, the number of servers instanced in FIG. 1B should not be construed as limiting. Further, as additional servers 190 are incorporated into network storage housing 110, additional systems 200 can be incorporated therein, as shown in FIGS. 4A and 4B.

Figure 2:
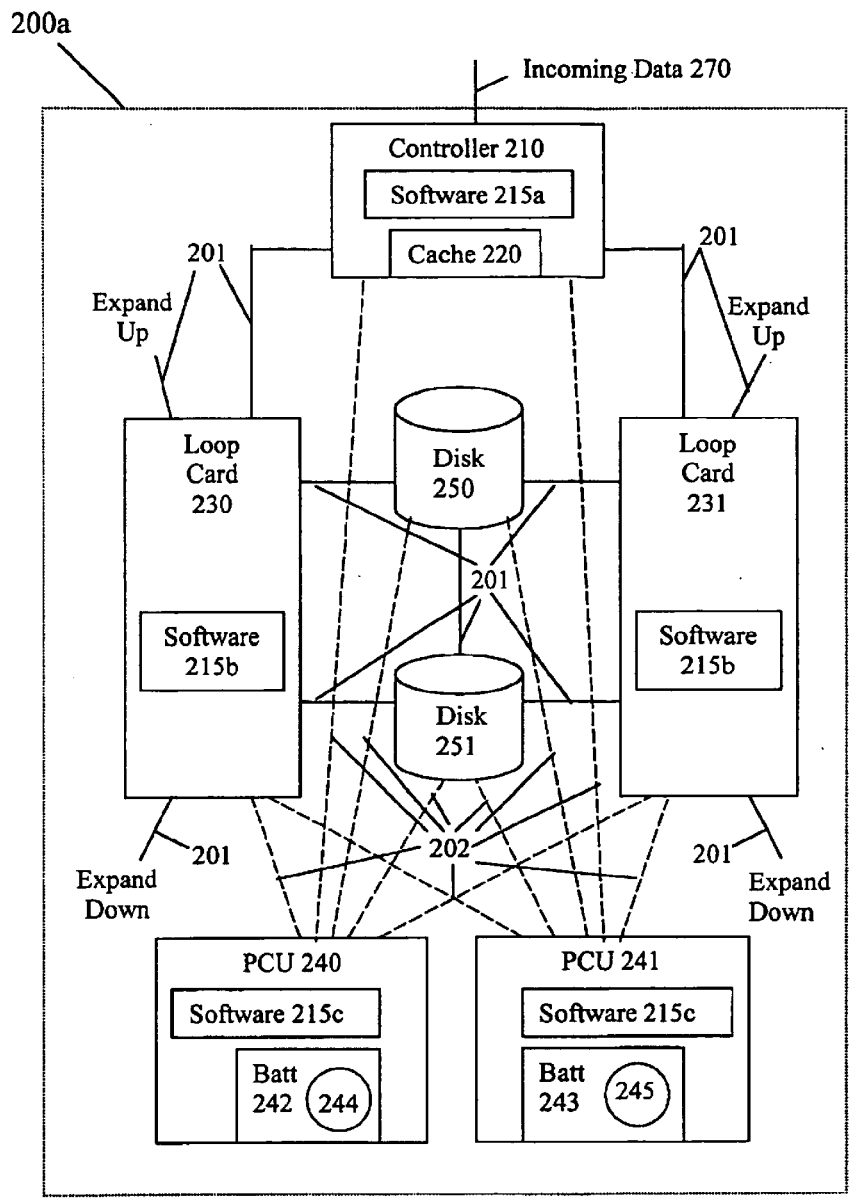
FIG. 2 is a block diagram of circuitry and components of an exemplary system for adjusting cache levels relative to charge levels of an exhaustible power source, in accordance with one embodiment of the present invention.

With reference to FIG. 2, portions of the present invention are comprised of computer-readable and computer executable instructions, e.g., software 215, of which portions, e.g., software portions 215a, 215b, and 215c, reside, for example, in computer-readable media of an electronic system, e.g., system 200.

FIG. 2 is a block diagram of a system 200a for providing auxiliary power to a data storage system, in one embodiment of the present invention. In one embodiment, system 200a is implemented in a data storage system, e.g., a rack mounted RAID (redundant array of inexpensive disks) system. It is noted that embodiments of the present invention are well suited to be implemented in nearly any type of data storage system including, but not limited to, a rack mounted RAID system.

FIG. 2 shows a controller 210 having a volatile memory unit, e.g., cache 220 disposed therewith, in one embodiment. Shown coupled to controller 210 are loop cards 230 and 231 via a data pathway, e.g., bus 201. Coupled to loop cards 230 and 231, also via bus 201, are non-volatile data storage devices, e.g., disks 250 and 251. It is noted that either loop card is able to communicate with any of the data storage devices coupled therewith. In one embodiment, disks 250 and 251 are large capacity rotating magnetic non-volatile data storage devices, e.g., hard disk drives. In another embodiment, disks 250 and 251 are large capacity rotating optical non-volatile data storage devices, e.g., writeable or re-writeable CDs or DVDs. Other types of large capacity non-volatile data storage devices can also be utilized. PCUs (power cooling units) 240 and 241, such as a PCU commercially available from Delta Electronics Inc. of Taiwan, Republic of China, are coupled with controller 210, loop cards 230 and 231 and disks 250 and 251, via an electrical pathway, e.g., power bus 202. It is noted that other functionally analogous PCUs can be so implemented.

Still referring to FIG. 2, PCU 240 is shown to have coupled therewith an exhaustible power source, e.g., rechargeable battery 242. PCU 241 is shown to have coupled therewith an exhaustible power source, e.g., battery 243. In one embodiment, batteries 242 and 243 of PCU 240 and 241, respectively, are analogous in charge capacity and functionality and are configured with respective monitoring devices, e.g., gauges 244 and 245, respectively. Gauges 244 and 245 are adapted to measure levels of charge in batteries 242 and 243, respectively. In one embodiment, a gauge, e.g., gauges 244 and 245, can display levels of charge in a digital manner. In another embodiment, a gauge, e.g., gauges 244 and 245, can display levels of charge in an analog manner. In one embodiment, a gauge can display charge levels as an energy value in a battery, battery 242 or 243. In another embodiment, a gauge can display charge levels as a percentage of charge level capacity of a battery. In one embodiment, batteries 242 and 243 are NiMH (nickel metal hydride) type batteries. The gauges 244 and 245 are able to report the level of charge on the batteries by an electronic signal that can be computer read.

In one embodiment, the storage capacity of cache 220 can range from 256 MBs (megabytes) to 2 GBs (gigabyte). In another embodiment, cache 220 capacity can be less than 256 MBs. In another embodiment, cache capacity can be greater than 2 GBs. In one embodiment, portions of cache 220 can be adapted for a particular use, and the sizes of those portions are adjustable. In accordance with the present invention, the portions are adjusted relative to the level of charge stored in PCUs 240 and 241. For example, cache 220 can have a capacity of 1.5 GB of which a 512 MB portion is allocated for dirty data. Dirty data is the term that relates to data that is to be written to a non-volatile memory device, e.g., disk 250 or disk 251, but in which the writing has yet to occur.

PCU 240 and 241 are configured to provide power and cooling to controller 210, loop cards 230 and 231, and disks 250 and 251, in the event that normal continuous power, e.g., power supplied by AC mains, is interrupted. It is noted that each individual PCU, e.g., PCUs 240 and 241, contains sufficient energy to solely provide operating power and sufficient cooling to controller 220, loop cards 230 and 231, and disks 250 and 251.

Still referring to FIG. 2, computer implemented instructions, e.g., software 215, is shown as having a portion thereof disposed in controller 210, e.g., software 215a, and a portion disposed in loop cards 220 and 230, e.g., software 215b, and a portion disposed in PCUs 240 and 241, e.g., software 215c. It is noted that software 215 is, in one embodiment, stored in a non-volatile memory device, e.g., a ROM chip.

Through data study, it is known that a PCU (240, 241) can provide a certain amount of power for a defined period of time, dependent upon the capacities and characteristics of the components to which it is coupled. Components with larger capacities require more power, and vice versa. It is further known that it takes a particular period of time to flush (write) the dirty cache portion of cache 220 to a disk. PCUs 240 and 241 are configured, in one embodiment, to provide sufficient power to the components to which it is coupled to enable complete flushing of the cache 220 to disks (151,152) before charge levels in batteries 242 and 243 are exhausted.

For example, assume cache 220 has a capacity of 1 GB. Cache 220 is configured with a 256 MB portion thereof allocated for dirty data. In the present example, it is known that it requires approximately six minutes to flush (write) the 256 MBs of data in cache 220 to a disk, e.g., disk 151 or 152. A controller, e.g., controller 210 receives a signal output from gauges 244 and 245 regarding the level of charge in batteries 242 and 243 in PCUs 240 and 241, respectively. Monitoring code within software 215a then interprets the data received from gauges 244 and 245, and as a proportion of the maximum level of charge contained in batteries 242 and 243, adjusts the dirty data portion of cache 220 accordingly based on the reported charge level, in this example, 256 MBs, so that sufficient charge is present to completely flush cache 220.

Still referring to the above example, assume both batteries, e.g., battery 242 of PCU 240 and battery 243 of PCU 241, can provide six minutes of power when fully charged. The particular period of time that batteries 242 and 243 can provide power is, in one embodiment, equivalent to the maximum amount of time needed to ensure the dirty data portion in cache 220 is completely written to disk prior to exhausting the charge stored in the batteries. It is noted that the particular period of time that batteries are adapted to provide operational power is dependent upon the capacities and requirements of the data storage system to which a PCU is to be coupled.

Gauge 244 measures a charge level in battery 242 which equates to four minutes of power, which is outputted to controller 210. This indicates a charge level reduction of approximately thirty-three percent of battery 242 in PCU 240. Gauge 245 measures a charge level in battery 243 which equates to three minutes of power, which is also outputted to controller 210. This indicates a charge level reduction of approximately fifty percent of battery 243 of PCU 241.

Software 215a, coupled with controller 210 then initiates an adjustment of the size of the dirty data portion of cache 220 relative to the battery with the lowest charge level. Accordingly, the dirty data portion of cache 220 is reduced from 256 MBs to approximately 128 MBs, a reduction of approximately fifty percent. By reducing the dirty data portion of cache 220 proportional to an amount of change in the charge level of the battery with the lowest charge level, system 200 can ensure sufficient power to completely flush cache 220 to disk (150,151) prior to charge levels of batteries 242 and 243 becoming exhausted.

If, in another example, gauge 244 still measures a charge level equating to four minutes, but gauge 245 measures a charge level in battery 243 which equates to five minutes of power. This indicates a charge level reduction of approximately seventeen percent of battery 243 of PCU 241. Accordingly, the dirty data portion of cache 220 is reduced from 256 MBs to approximately 171 MBs, a reduction equivalent to the thirty-three percent reduction of the charge level, because battery 242 has the lowest charge level.

Still referring to FIG. 2, software 215 further comprises instructions which, in one embodiment, are disposed in software portion 215a, and which enable an automatic flushing of dirty data in cache 220 to a disk, e.g., disk 250 or 251, when the amount of dirty data in cache 220 reaches a level that would require a longer time to flush than the operational time that can be provided by a battery, e.g., battery 242 or 243, prior to a battery exhausting the charge contained therein.

Battery Testing Embodiment

Still referring to FIG. 2, it is desirable to periodically test the condition of batteries 242 and 243 to ensure that the batteries are, at all times, in good condition and are able to consistently provide sufficient hold time (operational power) to enable cache 220 to write all of its data to disk, e.g., disk 151 and/or 152. In addition to adjusting the capacity of the dirty data portion of cache 220 relative to the level of charge of the battery having the lowest level of charge, as described above, software 215 also provides instructions which initiate a periodic test of the condition/health of the backup batteries, e.g., batteries 242 and 243. The health or condition of the battery directly affects the battery's ability to hold a charge. It is important to ensure that the battery, e.g., batteries 242 and 243, are able to hold an amount of charge sufficient to provide a level of charge that can, at all times, enable flushing of the entire cache prior to the charge in a battery being exhausted.

Accordingly, software 215 can, in one embodiment, periodically initiate a test to determine the condition of a battery and the ability of the battery to hold a charge. In one embodiment, the condition of a battery is tested once every two weeks. In other embodiments, the battery condition can be tested more frequently or less frequently, depending upon requirements of the system in which the battery is operated. In the present embodiment, battery 242 and 243 are each configured to provide six minutes of operational power to PCUs 240 and 241, respectively.

In one embodiment, to test the condition of batteries, software 215 interrupts the AC power supplied to the network storage system in which an auxiliary power source, e.g., auxiliary power system 200a is disposed. An interruption of AC power automatically activates PCU 240 to provide power to system 200a, in one embodiment, such that system 200a is using energy supplied by PCU 240. Battery 242 of PCU 240 is discharged for a specified period of time, wherein the discharging takes place while PCU 240 provides the necessary operating power to system 200a. If, at the end of the specified period of time, e.g., six minutes, battery 242 has provided energy enough to PCU 240 to operate system 200a for the specified period of time and the voltage associated with battery 242 has not dropped below a minimum voltage level, battery 242 is considered to have passed the condition testing.

In one embodiment, the specified period of time is that duration required to completely flush the cache. This period is shorter, generally, than a full discharge period.

In one embodiment, the minimum voltage level threshold can be set at eighteen volts and the maximum can be twenty-four volts. It is noted that minimum and maximum voltage levels can be adjusted to comply with power requirements nearly any environment where battery backup power is indicated. It is further noted that, in one embodiment, each battery can be comprised of multiple individual interconnected power cells. For example, a battery 242 can be comprised of 20 power cells, each having a voltage capacity of 1.2 volts, which equates to 24 volts. By limiting the discharge of the battery to the specified period of time, a reduction in damage to power cells due to excessive discharge is realized.

Subsequent to battery 242 passing the condition testing, battery 242 is then recharged. Subsequent to the recharging of battery 242, then battery 243 would then be subjected to the condition testing. It is noted that in a PCU environment where there are a plurality of batteries, such as those shown in FIGS. 2, 3, 4A, and 4B, a first battery is discharged and then recharged, prior to the discharging of a second battery.

Conversely, in the present example, if a battery, e.g., battery 242, does not provide operating power to PCU, e.g., PCU 240, for the specified period of time, it is considered to have failed the condition testing, and the battery is then replaced. Further, if battery 242 does provide operating power for the specified period of time, six minutes, but drops below the defined minimum voltage level, e.g., below eighteen volts, battery 242 is considered to have failed the condition testing, and accordingly, battery 242 is replaced.

It is further noted that by utilizing specified periods of time to control the amount of discharge of the battery, rather that full discharge periods, embodiments of the present method advantageously reduce generated heat within the data storage system to which it is coupled, and also decrease the instances of battery failure associated with complete discharging of a battery. Rather than full deep discharges, embodiments of the present invention employ a shallow discharge, such that expected battery performance and battery life expectancy is retained, and in many instances, increased.

Figure 3:
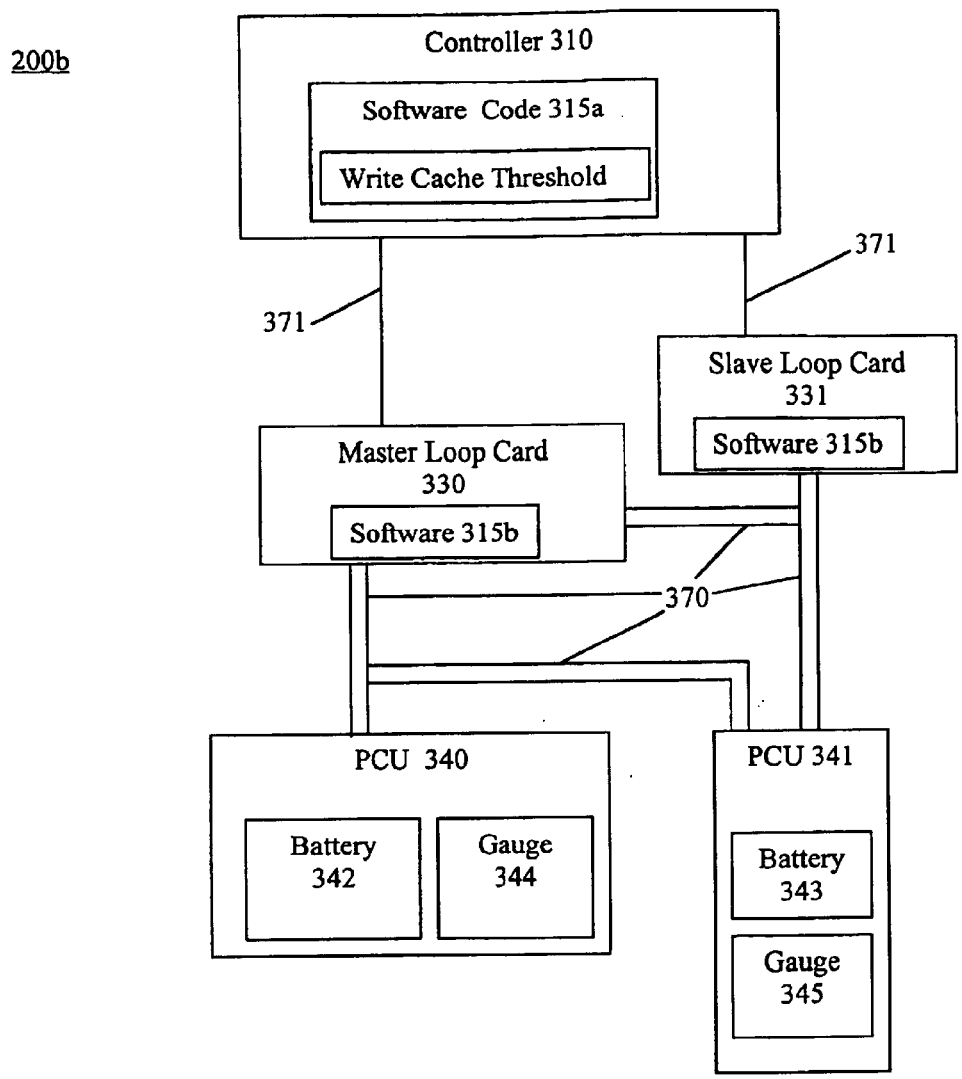
FIG. 3 is block diagram of circuitry and components of an exemplary system for adjusting cache levels relative to charge levels of an exhaustible power source, in accordance with one embodiment of the present invention.

FIG. 3 is a schematic block diagram illustrating components and circuitry in a system 200b, in an alternate embodiment of the present invention. Controller 310 is analogous to controller 210 of FIG. 2. Controller 310 is coupled with master loop card 330 via bus 371. Master loop card 330 is analogous to loop cards 230 and 231 of FIG. 2. In one embodiment, bus 371 is an RS 232 serial bus. It is noted that other bus protocols can be utilized including, but not limited to, USB, Firewire, parallel, and others. PCU 340 is analogous to PCU 240 and/or PCU 241 of FIG. 2.

Still referring to FIG. 3, also shown is slave loop card 331 coupled to controller 310 via bus 371. Slave loop card 331 is analogous to loop cards 230 and 231. Coupled to slave loop card is PCU 341,via bus 370. PCU 341 is also coupled with master loop card 330. In one embodiment, bus 370 is a two-wire bus, such as an SM (smart bus) type bus. Bus 370, in one embodiment, is compatible with $I^2C$ bus protocols.

Referring collectively to FIGS. 4A and 4B, shown are two examples of a plurality of systems 200, e.g., 400a and 400b, implemented to provide capacity and function expandability, enabling additional servers 190 to be coupled therewith, in accordance with other alternative embodiments of the present invention.

FIG. 4A is block diagram illustrating a plurality of systems 200, e.g., 400a and 400b, coupled together in a partner pair configuration, in one embodiment of the present invention. Systems 400a and 400b are functionally analogous to system 200 of FIG. 2. In a partner pair configuration, each system coupled therewith is analogous to the other, with each system 400a and 400b having its own controller and analogously sized cache, e.g., cache 411 of system 400a and cache 413 of system 400b.

It is further noted that, although not shown, each PCU, e.g., PCUs 440, 441, 442, and 443, is coupled with each component, controllers 410 and 411, loop cards 430, 431, 432, and 433, and disks 415, 416, 417, and 418, as is shown in FIG. 2. Each PCU contains sufficient charge capacity to provide operating power to each component enabling flushing of dirty data in cache 411 and cache 413, when AC main service is subject to interruption or failure. It is further noted that the capacities of cache 411 and 413 are adjusted in proportion to the PCU, 440, 441, 442 or 443, which has the least level of charge in its respective battery. Thus, systems 400a and 400b can provide sufficient power to enable writing of dirty data in cache 411 and 412 to disks 415, 416, 417, and 418, prior to the charge level of the battery becoming exhausted.

FIG. 4B is a block diagram illustrating a plurality of systems 400a and 401 coupled together in a unified cache configuration, in one embodiment of the present invention. In this example, a system 400a, analogous to a system 200 of FIG. 2 is coupled with a system 401. System 401 is shown having the components of system 200 with the exception of a controller and a cache, as seen in system 400a. In this example, both systems 400a and 401 use the same controller, controller 411, and the same cache, cache 411. This configuration increases the amount of non-volatile storage, while being restricted to the amount of cache as determined by controller 410.

Still referring to FIG. 4B, it is noted that, although not shown, each PCU, e.g., PCUs 440, 441, 442, and 443, is coupled with each component, controllers 410 and 411, loop cards 430, 431, 432, and 433, and disks 415, 416, 417, and 418, as is shown in FIG. 2. Each PCU contains sufficient charge capacity to provide operating power to each component enabling flushing of the dirty data in cache 411 when AC main service is subject to interruption or failure. It is further noted that the capacity of cache 411 is adjusted in proportion to the PCU, 440, 441, 442 or 443, that has the least level of charge in its respective battery. Thus, systems 400a and 401 can provide sufficient power to enable writing of dirty data in cache 411 and 412 to disks 415, 416, 417, and 418, prior to the charge level of the battery becoming exhausted.

Figure 5:
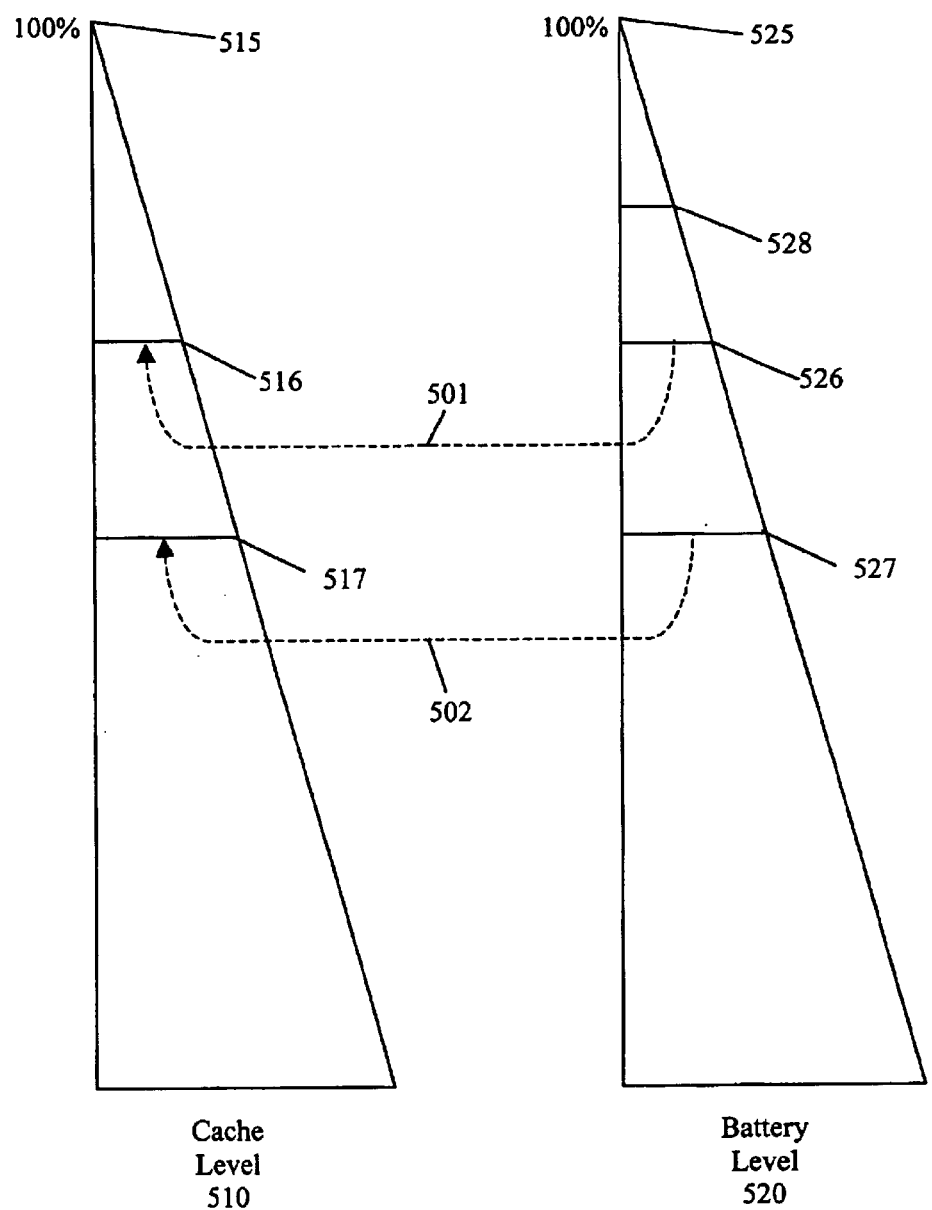
FIG. 5 is a diagram illustrating a relative relationship between cache storage levels and charge levels of an exhaustible power source, in accordance with one embodiment of the present invention.

FIG. 5 is an illustration of that portion of cache, e.g., cache 220, that is allocated for dirty data storage, e.g. cache level 510, in one embodiment of the present invention, that is adjusted in proportion to the level of charge, charge level 520, contained within the PCU which has the lowest charge level in its respective battery. Cache level 510 represents the amount of cache 220 (FIG. 2) allocated for dirty data and battery level 520 represents the level of charge in the battery, e.g., battery 242 or battery 243 (FIG. 2) that has the lowest level of charge. In this example, cache level 510 has a capacity of 500 MBs allocated for dirty data, and it is known that it requires ten minutes to flush the dirty data in cache level 510 to a disk, e.g., disks 150 and 151. Further, batteries 242 and 243 have a maximum charge capacity to provide ten minutes of operational power to system 200 of FIG. 2.

Still referring to FIG. 5 and to example 501 (dotted line), if gauge 244 reports that the level of charge of battery 242 is approximately one third less than maximum, indicated by line 526, and gauge 245 indicates the level of charge of battery 243 is approximately one quarter less than maximum, indicated by line 528, the amount allocated in cache 510 for dirty data storage is reduced by a proportional amount relative to the battery having the lower level of charge. Because battery 242 has the lower level of charge, in this example 33% as indicated by line 526, the capacity of cache level 510 is reduced by 33%, as indicated by line 516.

In another example, example 502 (dotted line), if gauge 244 reports that the level of charge of battery 242 is approximately one third less than maximum, indicated by line 526, and gauge 245 indicates the level of charge of battery 243 is approximately one half less than maximum, indicated by line 527, the amount allocated in cache 510 for dirty data storage is reduced by a proportional amount relative to the battery having the lower level of charge. Because battery 243 has the lower level of charge, in this example 50% as indicated by line 527, the capacity of cache level 510 is reduced by 50%, as indicated by line 517.

It is noted that when the amount dirty data stored in cache 220 requires more time to flush than can be sufficiently provided by a PCU, e.g., PCU 240, an automatic flushing of dirty data to a disk, e.g., disk 150 and/or 151 will occur.

Figure 6:
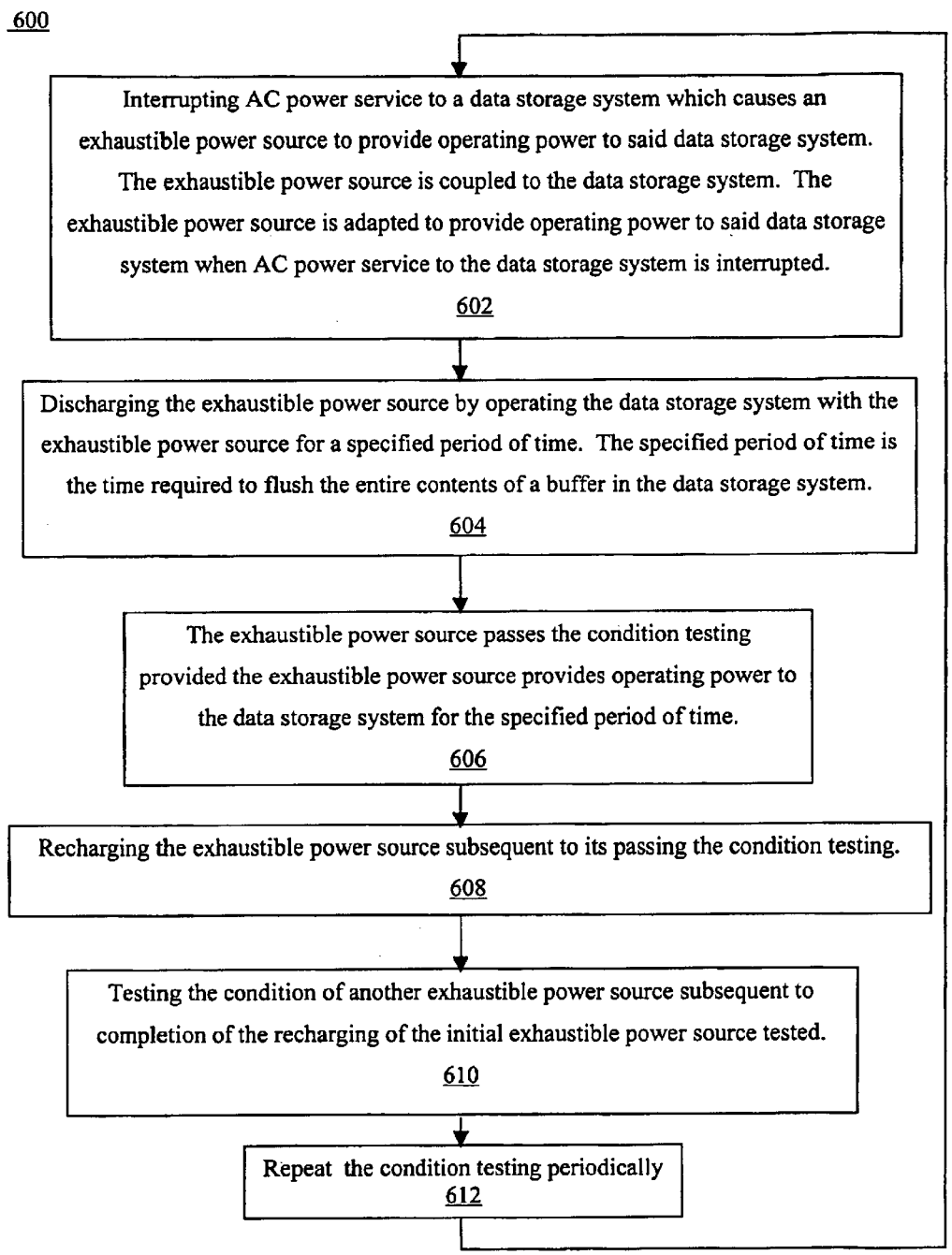
FIG. 6 is flowchart of steps in a process for monitoring the condition of an exhaustible power source, in accordance with one embodiment of the present invention.

FIG. 6 is a flowchart 600 of steps performed in accordance with one embodiment of the present invention for monitoring the condition of a battery in a battery backup. Flowchart 600 includes processes of the present invention which, in one embodiment, are carried out by electrical components under the control of computer readable and computer executable instructions. The computer readable and computer executable instructions reside, for example, in data storage features such as computer usable non-volatile memory of FIG. 2. However, the computer readable and computer executable instructions may reside in any type of computer readable medium. Although specific steps are disclosed in flowchart 600, such steps are exemplary. That is, the present invention is well suited to performing various other steps or variations of the steps recited in FIG. 6. Within the present embodiment, it should be appreciated that the steps of flowchart 600 may be performed by software, by hardware or by any combination of software and hardware, and may be executed on an embedded computer system.

In step 602 of FIG. 6, AC power service to a data storage system, e.g., data storage system 200, is interrupted, in one embodiment. In the present embodiment, an interruption of AC power causes an automatic activation of a battery backup, e.g., PCU 240 or 241 of FIG. 2, or PCU 340 and 341 of FIG. 3, or PCU 440, 441, 442, and 443 of FIG. 4A or PCUs 440 and 441 of FIG. 4B, to provide operating power to data storage system 200. For example, as shown in FIG. 2A, there is a battery in each PCU, battery 242 in PCU 240 and battery 243 in PCU 241. In one embodiment, software 215 is adapted to first check the condition of battery 242 of PCU 240 and then check the condition of battery 243 of PCU 241, and in another embodiment, vice versa.

In step 604 of FIG. 6, the exhaustible power source, battery 242, in the PCU providing power to data storage system 200, PCU 240, is discharged, in one embodiment. The discharging is accomplished by operating data storage system 200 with PCU 240, thus battery 242, for the period of time required to completely flush the contents of the cache. As described in FIG. 2, the specified period of time is, for this example, six minutes, although alternative periods of time can be implemented, depending upon the capacities and requirements of the data storage system to which a PCU is coupled.

In step 606, in the present embodiment, if battery 242 provides the six minutes of power as designed, without having its voltage levels fall below a minimum voltage level, e.g., 18 volts, battery 242 is considered to have passed the condition testing.

In step 608, after passing the condition testing, battery 242 of PCU 240 is then recharged.

In step 610, subsequent to battery 242 being recharged, a second exhaustible power source, e.g., battery 243 of PCU 241, has its condition tested, analogous to condition testing of battery 242, as described above. It is noted that when more than two batteries are present within a data storage system 200, each of the batteries are analogously subjected to condition testing. This means that the first battery is tested, recharged, and then the next battery is tested and recharged, and so on.

In step 612 of FIG. 6, in one embodiment, the process of monitoring the condition of a battery in a battery backup is periodically repeated, e.g., once every fourteen days. It is noted that the process of monitoring the condition of a battery in a battery backup can be performed less or more frequently, depending, in part, upon the data storage system in which the battery backup system is implemented.

Advantageously, embodiments of the present invention provide a method for testing the condition of a battery in a battery backup system. Further advantageously, embodiments of the present invention test the condition of the battery while the temperature of the battery and the temperature of the data storage system to which the battery backup system is coupled remains substantially constant. Additionally advantageous is that by implementing a shallow discharge, the life expectancy of the battery is increased and the likelihood of battery failure is reduced.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for battery condition testing comprising:
   interrupting AC power service to a data storage system causing an exhaustible power source to provide operating power to said data storage system said exhaustible power source coupled to said data storage system, said exhaustible power source adapted to provide operating power to said data storage system and to enable complete flushing of data in a buffer, said buffer coupled with said data storage system, when said AC power service to said data storage system is interrupted;
   discharging said exhaustible power source by operating said data system with said exhaustible power source for a specified period of time, said specified period of time sufficient to fully flush contents of said buffer; and
   passing said condition testing provided said exhaustible power source provides operating power to said data storage system for said specified period of time.

2. The method as recited in claim 1 further comprising recharging said exhaustible power source subsequent to said exhaustible power source passing said condition testing.

3. The method as recited in claim 1 further comprising replacing said exhaustible power source when said exhaustible power source fails said condition testing.

4. The method as recited in claim 1 further comprising controlling said discharging of said exhaustible power source to prevent said exhaustible power source from being discharged to a level detrimentally affecting said exhaustible power source, said level being below a preferred minimum voltage threshold.

5. The method as recited in claim 1 further comprising adjusting said specified period of time dynamically, relative to an amount of time required to write an amount of data is said buffer to said data storage system.

6. The method as recited in claim 1 wherein said discharging of said exhaustible power source is a shallow discharge.

7. The method as recited in claim 1 further comprising measuring a voltage level of said exhaustible power source.

8. The method as recited in claim 1 wherein said data storage system is operated in a high temperature high current environment.

9. A method for testing the condition of a battery in a battery backup system comprising:
   interrupting AC power service to a data storage system;
   responsive to said interrupting, providing operating power to said data storage system from a battery backup system, said battery backup system adapted to provide operating power to said data storage system to enable flushing of data in a buffer, said buffer coupled with said data storage system when AC power to said data storage system is interrupted, said battery backup system comprising a plurality of rechargeable power sources;
   discharging one of said plurality of rechargeable power sources by operating said data storage system with said one of said plurality of rechargeable power sources for a particular period of time, said particular period of time sufficient to completely flush contents of said buffer; and
   passing condition testing of one of said plurality of rechargeable power sources when said data storage system is operable for said particular period of time while being provided operating power by said one of said rechargeable power sources.

10. The method as recited in claim 9 further comprising recharging said one of said plurality of rechargeable power sources subsequent to said one passing said condition testing.

11. The method as recited in claim 9 wherein said discharging further comprises discharging another of said plurality of rechargeable power sources subsequent to said one of said plurality of rechargeable power sources being discharged and recharged.

12. The method as recited in claim 9 further comprising replacing any of said plurality of said rechargeable power sources when any of said plurality of rechargeable power sources fails said condition testing.

13. The method as recited in claim 9 further comprising adjusting said particular period of time dynamically, said particular period of time equivalent to the time required to write an amount of data from said buffer to said data storage system.

14. The method as recited in claim 13 wherein said discharging is a shallow discharge.

15. A computer readable medium for storing computer implemented instructions, said instructions causing a battery backup system to perform:
   interrupting AC power to a data storage system causing a battery in said battery backup system to provide operating power to said data storage system, said battery backup system coupled to said data storage system;

discharging said battery by operating said data storage system with said battery for a defined period of time, said discharging for condition testing of said battery, said defined period of time required to write the entire contents of a buffer in said data storage system to a non-volatile memory unit in said data storage system; and passing condition testing of said battery provided said battery provides operating power to said data storage system for said defined period of time.

16. The computer readable medium of claim 15 wherein said computer implemented instructions cause said battery backup system to perform:

recharging said battery subsequent to said battery passing said condition testing.

17. The computer readable medium of claim 15 wherein said computer implemented instructions cause said battery backup system to perform:

controlling said discharging of said battery to prevent said battery from being discharged to a level below a preferred minimum voltage level.

18. The computer readable medium of claim 15 wherein said computer implemented instructions cause said battery backup system to perform:

adjusting said period of time dynamically, relative to an amount of data in said buffer of said data storage system.

19. The computer readable medium of claim 15 wherein said computer implemented instructions cause said battery backup system to perform:

measuring a voltage level of said battery.

20. The computer readable medium of claim 15 wherein said computer implemented instructions cause said battery backup system to perform:

discharging another battery in said battery backup system, when present, subsequent to recharging said battery.

21. The computer readable medium of claim 15 wherein said discharging is a shallow discharge.

22. The computer readable medium of claim 15 wherein said battery backup system is implementable in a high current, high temperature environment.

* * * * *